(12) United States Patent
Gao

(10) Patent No.: US 10,418,775 B2
(45) Date of Patent: Sep. 17, 2019

(54) EXTERNAL CAVITY TUNABLE LASER WITH DUAL BEAM OUTPUTS

(71) Applicant: GP PHOTONICS, INC., Tianjin (CN)

(72) Inventor: Peiliang Gao, Victoria (CA)

(73) Assignee: GP PHOTONICS, INC., Tianjin (CN)

( * ) Notice: Subject to any disclaimer, the term of this patent is extended or adjusted under 35 U.S.C. 154(b) by 0 days.

(21) Appl. No.: 14/990,758

(22) Filed: Jan. 7, 2016

(65) Prior Publication Data

US 2016/0118763 A1 Apr. 28, 2016

Related U.S. Application Data

(63) Continuation-in-part of application No. PCT/CN2014/084464, filed on Aug. 15, 2014.

(30) Foreign Application Priority Data

Jan. 4, 2014 (CN) .......................... 2014 1 0002580

(51) Int. Cl.
*H01S 3/106* (2006.01)
*H01S 5/14* (2006.01)
(Continued)

(52) U.S. Cl.
CPC ............ *H01S 3/106* (2013.01); *H01S 3/1068* (2013.01); *H01S 5/141* (2013.01); *G02F 1/33* (2013.01);
(Continued)

(58) Field of Classification Search
CPC .... H01S 3/1062; H01S 3/1065; H01S 3/1068; H01S 5/1234
See application file for complete search history.

(56) References Cited

U.S. PATENT DOCUMENTS

2007/0041081 A1* 2/2007 Chu ........................ G02F 1/116
359/305
2008/0025349 A1* 1/2008 Mizutani ................. H01S 5/141
372/20
(Continued)

FOREIGN PATENT DOCUMENTS

CN 102709799 A * 10/2012 ............... H01S 3/08
WO WO2011120246 * 10/2011

*Primary Examiner* — Tod T Van Roy

(57) ABSTRACT

The invention relates to an external cavity tunable laser with dual beam outputs. The first laser cavity of the tunable laser comprises a first laser cavity mirror, a laser gain medium, an intracavity collimating lens, an active optical phase modulator, a tunable acousto-optic filter, a tunable Fabry-Perot tunable filter, a second reflection mirror all disposed inside a laser cavity sequentially, and a laser driver and control system. The laser cavity beam reflected by the first laser cavity mirror enters the tunable acousto-optic filter to generate a zeroth order diffracted beam as the first laser output beam. The laser cavity beam reflected by the second laser cavity mirror enters the tunable acousto-optic filter to generate a zeroth order diffracted beam as the second laser output beam. The tunable laser further comprises a wavelength locker outside the laser cavity. The second laser cavity of the tunable laser has a Fabry-Perot etalon disposed in the first laser cavity to further compress the spectrum width of the laser output beams. The invention is compact with high performance without mechanical moving parts, stable laser output, low cost for volume production and installation.

18 Claims, 7 Drawing Sheets

(51) Int. Cl.
  *G02F 1/33* (2006.01)
  *H01S 3/082* (2006.01)
  *H01S 3/101* (2006.01)
(52) U.S. Cl.
  CPC .............. *H01S 3/0823* (2013.01); *H01S 3/101* (2013.01); *H01S 3/1062* (2013.01); *H01S 3/1065* (2013.01)

(56) References Cited

U.S. PATENT DOCUMENTS

2013/0022062 A1* 1/2013 Gao ..................... H01S 3/1068
  372/20
2015/0003487 A1* 1/2015 Gao ..................... H01S 3/1062
  372/107

* cited by examiner

EXTERNAL CAVITY TUNABLE LASER WITH DUAL BEAM OUTPUTS

CROSS-REFERENCE TO RELATED APPLICATIONS

This application is Continuation-In-Part Application of PCT application Serial No. PCT/CN2014/084464, filed on Aug. 15, 2014 which claims priority from Chinese Patent Application Serial No. 201410002580.8, filed on Jan. 4, 2014, the entire contents of which are incorporated herein by reference for all purposes.

TECHNICAL FIELD

The invention belongs to the field of photonics, and in particular relates to an external cavity tunable laser with dual beam outputs using a tunable acousto-optic filter and a tunable Fabry-Perot filter based on a liquid crystal optical phase modulator.

BACKGROUND

There are typically three tuning technologies used in an external cavity tunable laser: 1), tuning is achieved by using a precision stepping motor to drive a grating to rotate. This technology has the following shortcomings: first, there are quite high requirements on the stepping moving precision and the repeatability of the stepping motor in achieving precision optical frequency tuning, thus the cost is relatively high; second, the miniaturization is hardly achieved due to the stepping motor used; and third, the operational stability is poor under a harsh working environment, in particular, low resistances to various mechanical vibrations. Because of these problems, the tunable laser using this technology is often used under a laboratory working environment. 2) tuning is achieved by a tunable acousto-optic filter. This technology has the advantages of high tuning speed, no mechanical moving component and small size. The major shortcoming is the low tuning precision and relatively wide filtering bandwidth, therefore, the tunable laser using this technology is only suitable for applications in which both the tuning precision and the output bandwidth are not high. 3) tuning is based upon the temperature-sensitive characteristics of the transmission optical frequency of a grating or other optical filtering devices in the laser resonant cavity, such as an optical Etalon. This tuning technology has high tuning precision and relatively narrow output spectrum bandwidth, but low tuning speed. Therefore, it is not suitable when the wide spectral range tuning is needed, for example: if the temperature coefficient of an optical filtering device is 0.02 nanometers per degree Celsius, the desired spectral range and temperature adjustment range are 20 nanometers and 100 degrees respectively, which is impracticable for some applications.

SUMMARY OF THE INVENTION

It is an objective of the invention to overcome the shortcomings in the prior art and to provide a tunable laser with low cost, small size, easy manufacturing and high performance.

The technical scheme below is adopted by the invention for solving the technical problems in the prior art:

An external cavity tunable laser with a first output beam and a second output beam of the first scheme comprises a first laser cavity mirror, a laser gain medium, an intra-cavity collimating lens, an active optical phase modulator; (OPM), a tunable acousto-optic filter; (AOTF), a tunable Fabry-Perot filter; (TFPF), a second laser cavity mirror, the first laser cavity mirror and the second laser cavity mirror forming a laser cavity, and a laser drive and control system;

the TFPF includes a glass plate and a liquid crystal OPM, the glass plate of the TFPF having an inner surface facing the liquid crystal OPM and an outer surface opposite the inner surface, the inner surface being coated with a highly reflective dielectric thin film and the outer surface being coated with an anti-reflection thin film;

the liquid crystal OPM includes a first thin plate and a second thin plate and a liquid crystal disposed therebetween, each thin plate having an inner surface facing the liquid crystal and the inner surface of the second thin plate being coated with a high reflection coating, an electrode, and an isolation layer; wherein the intra-cavity collimating lens collimates a light beam transmitted from the laser gain medium and inputs the collimated beam into the AOTF at a Bragg angle to generate a zeroth order and a first-order first diffracted beam after passing through the active OPM;

the TFPF is disposed on an opposite side of the AOTF from the laser gain medium and in an optical path of the first-order first diffracted beam generated by the AOTF;

the second laser cavity mirror is disposed on the opposite side of the AOTF from the laser gain medium and behind TFPF to reflect the first-order first diffracted beam back to the AOTF at the Bragg angle to generate a zeroth order and a first-order second diffracted beam after passing through the tunable TFPF;

an optical axis of the second laser cavity mirror aligned to an optical axis of the first order first diffracted beam;

the AOTF and the TFPF operate together as a single mode and continuous wavelength tunable filter with a narrow spectrum output so that only the first-order diffracted beams resonate in the laser cavity; and the first output beam is the zeroth order first diffracted beam and the second output beam is the zeroth order second diffracted beam.

An external cavity tunable laser having first output beam and a second output beam of the second scheme comprises a first laser cavity mirror, a laser gain medium, an intra-cavity collimating lens, an active optical phase modulator; (OPM), a tunable acousto-optic filter; (AOTF), a tunable Fabry-Perot filter; (TFPF), an etalon, a second laser cavity mirror, the first laser cavity mirror and the second laser cavity mirror forming a laser cavity; and a laser drive and control system;

the TFPF includes a glass plate and a liquid crystal OPM, the glass plate of the TFPF having an inner surface facing the liquid crystal OPM and an outer surface opposite the inner surface, the inner surface being coated with a highly reflective dielectric thin film and the outer surface being coated with an anti-reflection thin film;

the liquid crystal OPM includes a first thin plate and second thin plate and a liquid crystal disposed therebetween, each thin plate having an inner surface facing the liquid crystal and the inner surface of the second thin plate being coated with a high reflection coating, an electrode, and an isolation layer;

the intra-cavity collimating lens collimates a light beam transmitted from the laser gain medium and inputs the collimated beam into the AOTF at a Bragg angle to generate a zeroth order and a first-order first diffracted beam after passing through the active OPM;

the TFPF is disposed on the opposite side of the AOTF from the laser gain medium and in an optical path of the first-order first diffracted beam generated by the AOTF;

the etalon is disposed behind the TFPF;

the second laser cavity mirror is disposed on the opposite side of the AOTF from the laser gain medium and behind the etalon to reflect the first-order first diffracted beam back to the AOTF at the Bragg angle to generate a zeroth order and a first-order second diffracted beam after passing through the etalon and the TFPF;

an optical axis of the second laser cavity mirror is aligned to an optical axis of the first-order first diffracted beam;

the AOTF and the TFPF operate together as a single mode and continuous wavelength tunable filter with a narrow spectrum output so that only the first-order diffracted beams resonate in the laser cavity; and the first output beam is the zeroth order first diffracted beam and the second output beam is the zeroth order second diffracted beam.

Further, the external cavity tunable laser with a first output beam and a second output beam of the first and second scheme, wherein the TFPF has a transmission frequency of the tunable Fabry Perot filter with a tuning range and a free spectrum range; and wherein the tuning range of the transmission frequency of the TFPF is equal to or larger than the free spectrum range of the TFPF.

Further, the external cavity tunable laser with a first output beam and a second output beam of the first and second scheme, wherein the first laser cavity mirror and the second laser cavity mirror are at least one mirror selected from the group consisting of a plane mirror, a convex mirror and a concave mirror with equal to or less than 100% reflectivity; wherein the first laser cavity mirror and the second laser cavity mirror have a spectrum range equal to or larger than a spectrum range of the laser gain medium; and wherein the first laser cavity mirror is a multilayer dielectric thin film coated directly on the laser gain medium.

Further, the external cavity tunable laser with a first output beam and a second output beam of the first and second scheme, wherein the laser gain medium is a broadband laser gain medium.

Further, the external cavity tunable laser with a first output beam outputs and a second output beam of the first and second scheme, wherein the active OPM is at least one modulator selected from the group consisting of an opto-electric, an acousto-optic, and an opto-magnetic optical phase modulator or a combination of the above optical phase modulators.

Further, the external cavity tunable laser with a first output beam and a second output beam of the first and second scheme, wherein the liquid crystal of the liquid crystal OPM is of a nematic type and has the same spectrum range as the laser gain medium, and the AOTF includes an anisotropic and birefringent crystal.

Further, the external cavity tunable laser with a first output beam and a second output beam of the first and second scheme, wherein the laser drive and control system includes a central control system, a laser pump source, a driver for the active OPM and a driver for the TFPF; and wherein the central control system is connected to the laser pump source, the driver for the active OPM, a radio frequency signal source of the AOTF and the driver for the TFPF to perform a laser drive and control function.

Further, the external cavity tunable laser with a first output beam and a second output beam of the first and second scheme comprise a wavelength locker that includes a wavelength locking etalon, a photo detector and a photo detector signal processing unit; wherein the wavelength locking etalon is disposed in the optical axis of the second laser output beam, the photo detector is disposed behind the wavelength locking etalon to detect the second output beam power after passing through the wavelength locking etalons, and the photo detector signal processing unit is connected to the photo detector and the laser drive and control system to process a signal from photo detector and feedback the signal to the laser drive and control system to perform the wavelength locking.

The invention has the following advantages and positive effects:

1. The tunable Fabry-Perot filter is based on the conventional Fabry-Perot etalon technology using the liquid crystal optical phase modulator as tuning element which has a thin lay of liquid crystal about a few to a little more than ten micrometer thickness in the optical path. By combing the tunable acousto-optic filter and the tunable Fabry-Perot filter, the requirement for the tunable acousto-optic filter to provide narrow spectral bandwidth can be lowered; the fast tuning speed within a wide spectral range and the narrow spectral bandwidth of the laser output can be achieved.

2. The tunable acousto-optic filter in the laser cavity generates two zeroth order diffracted beams as two laser output beams without additional parts and optical beam splitting devices inside laser cavity; the two laser output beams can be simultaneously tunable and can also be used independently and simultaneously. The fact that the difference of the optical frequency between the two laser output beams is equal to the driving frequency of the tunable acousto-optic filter makes the invention useful in the field of precision measurement using laser technologies; and has the advantage over the laser with a single output beam in such an aforementioned application field.

3. The tunable laser is compact with high performance without mechanical moving parts, low cost for volume production and easy installation, achieves high spectral tunning precision of less than 1 GHz, narrow spectral bandwidth and stable tunable laser output within a wide spectral range, and can meet the requirements for small size and reliable operation in an extreme working environment. Furthermore, the invention can also be widely used in the fields of optical measurement, fiber optical telecommunication, biology, medical instrumentation and fiber optical sensor networking.

DETAILED DESCRIPTION OF THE EMBODIMENT

Further detailed description is made below to the embodiment of the invention with reference to the drawings.

Tunable Acousto-Optic Filter

Figure 1:
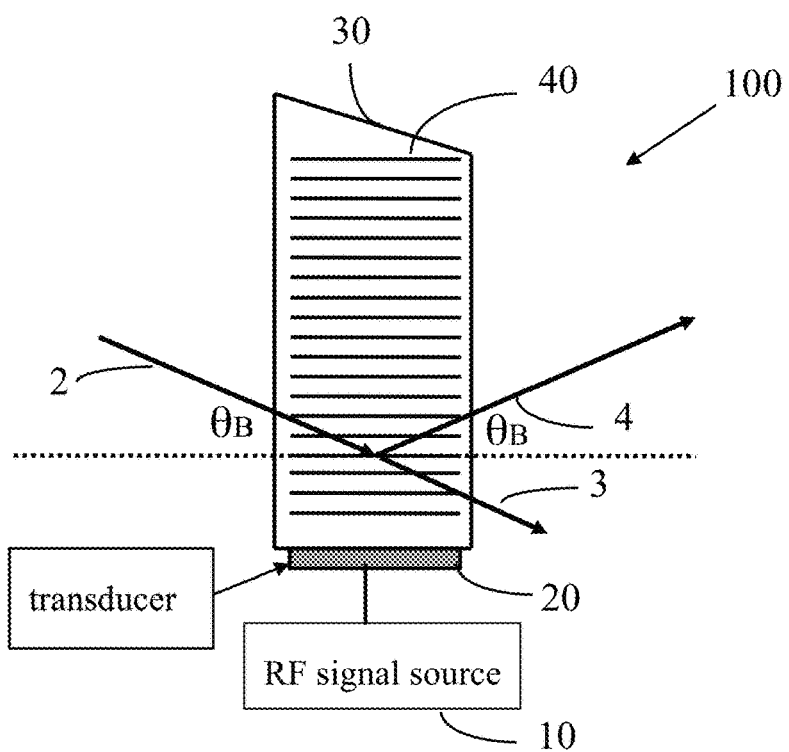
FIG. 1 is a schematic diagram of a conventional tunable acousto-optic filter.

FIG. 1 illustrates a conventional tunable acousto-optic filter 100. The tunable acousto-optic filter 100 comprises a transducer 20, a radio frequency signal source 10 and an acousto-optic crystal 30. The transducer 20 is connected to the radio frequency signal source 10 to generate an acoustic wave 40. An incident light beam 2 enters the acousto-optic crystal 30 at Bragg angle 8B to generate a zero-order diffraction light beam 3 and a first-order diffraction light beam 4.

Figure 2:
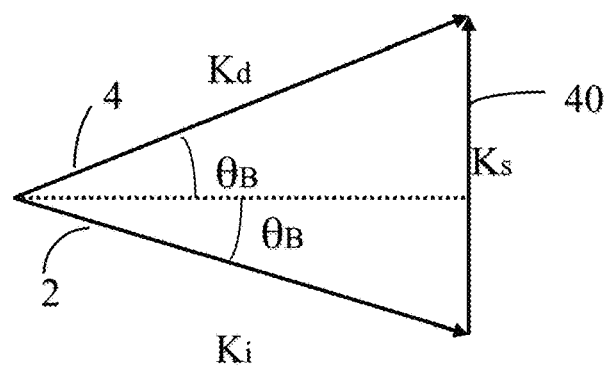
FIG. 2 is a wave vector relation diagram of the incident beam of the first diffraction; the acoustic wave field and the diffracted light beam in the acousto-optic crystal.

The principle of the acousto-optic filter is based upon a phenomenon known as Bragg diffraction that involves the interaction process of photons (light energy's quanta) and phonons (acoustic energy's quanta). Both energy and momentum are conserved in this interaction process. $\hbar\kappa_d = \hbar\kappa_i + \hbar\kappa_s$ is required in momentum conservation, wherein $\hbar\kappa_d$ is the momentum of diffraction photon, $\hbar\kappa_i$ is the momentum of incident photon and $\hbar\kappa_s$ is the momentum of interactive phonon. The formula below is obtained after $\hbar$ is removed: $\kappa_d = \kappa_i + \kappa_s$, which is the fundamental wave vector equation in Bragg diffraction and means that the diffracted light wave vector is the vector sum of the incident light wave vector and the acoustic wave vector, as shown in FIG. 2.

The relation of $(\hbar\omega_r = \hbar\omega + \hbar\Omega)$ is required in energy conservation, wherein $\omega_r$ is the angular frequency of diffracted light, w is the angular frequency of incident light and $\Omega$ is the angular frequency of acoustic wave. The formula below is obtained after n is removed: $\omega_r = \omega + \Omega$. This means that the angular frequency of diffraction photon is slightly altered by the angular frequency of the acoustic wave, or so called Doppler frequency shift.

Doppler frequency shift in AOTF is small because acoustic wave frequency is of many orders of magnitude smaller compared with the light wave frequency. FIG. 2 illustrates the relations between the diffracted light wave vector ($\kappa_d$), the incident light wave vector ($\kappa_i$) and the acoustic wave vector, ($\kappa_s$). The wave vector of the incident light wave 2 ($\kappa 2$), the wave vector of the diffracted light wave 4 ($\kappa 4$) and the acoustic wave vector $\kappa s$ have the following relation: $\kappa_4 = \kappa_2 + \kappa_s$. This means that the diffracted light wave is up shifted, and the angular frequency of diffraction light is also up shifted by $\Omega = vs\,|\kappa s|$, wherein vs is the velocity of the acoustic waves.

Figure 7:
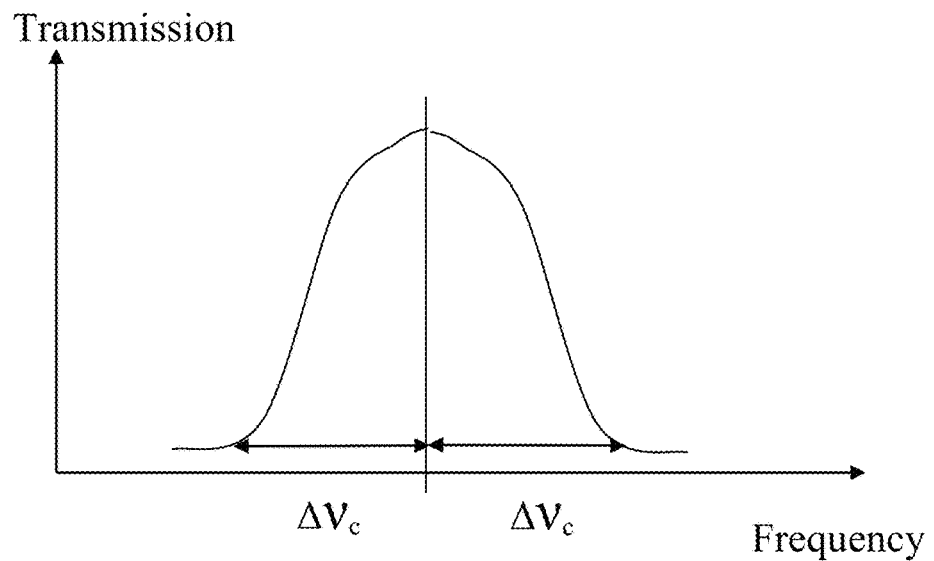
FIG. 7 is a schematic diagram of the diffracted beam spectrum of the tunable acousto-optic filter.

Acousto-optic Tunable Filter (AOTF) 100 is a solid-state band pass optical filter that can be tuned by electric signal. Compared with the traditional techniques, AOTF provides continuous and fast tuning capability. Acousto-optic filters can be divided in two categories: collinear and non-collinear. Narrow-band filtering can be realized by a non-collinear and far off-axis type filter. FIG. 7 is a schematic diagram of the diffracted beam spectrum of the tunable acousto-optic filter. Δvc is the spectral width of the diffracted light, which is defined herein as the difference between the frequency at maximum diffracted light and the frequency at the zero or near zero diffracted light. For the non-symmetric diffracted light spectrum, Δvc is different at two sides of the spectrum, Δvc is defined as the larger side of the frequency difference between frequency at maximum diffracted light and the frequency at the zero or near zero diffracted light. Generally speaking, Δvc can be less than 125 GHz or about 1 nm in terms of wavelength in the near-infrared spectrum, or more than 1250 GHz (about 10 nm in terms of wavelength in the near-infrared spectrum) depending on the different types of the acoustic filter and the interaction length.

In some embodiment, for example, when narrow-band tuning is needed, an anisotropic and birefringent acousto-optic crystal is used. One of the crystals is tellurium dioxide ($TeO_2$), which is widely used in such applications because it has high optical uniformity, low light absorbance and high damage threshold to optical power when operating under a shear mode. Other crystals such as lithium niobate ($LiNbO_3$), gallium phosphide (GaP) and lead molybdate ($PbMoO_4$) are also frequently used in a variety of acousto-optic sources. There are several factors that influence the choice of a particular crystal such as the type of acousto-optic source, whether high-quality crystal is easily available and the requirements of a particular application, such as diffraction efficiency, power loss, degree of dispersion of the incident light and the diffracted light and overall source size, etc.

Fabry-Perot Etalon

Figure 3:
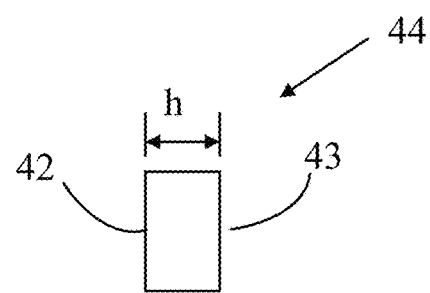
FIG. 3 is a schematic diagram of a conventional Fabry-Perot etalon.
Figure 8:
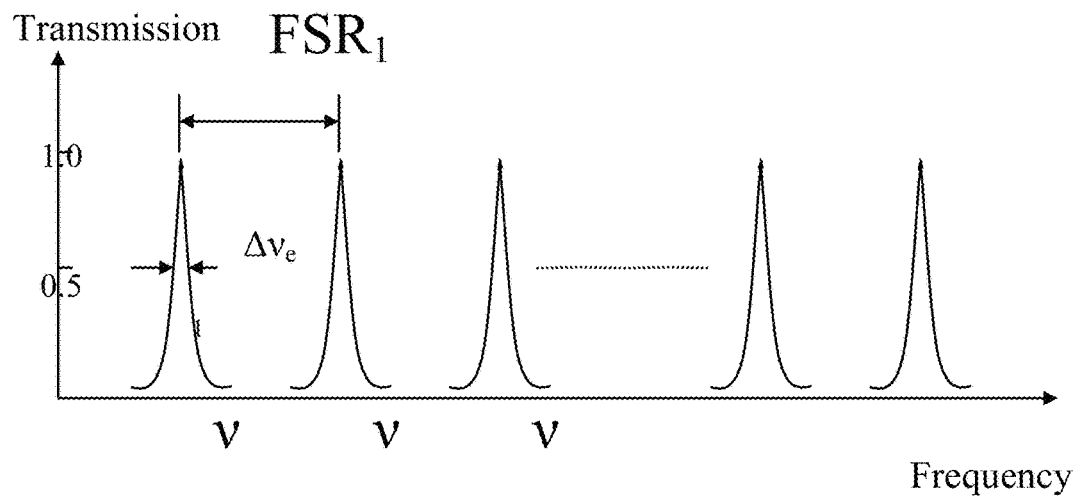
FIG. 8 shows the transmission spectrum of a conventional Fabry-Perot etalon.

FIG. 3 illustrates a conventional Fabry-Perot etalon 44. For the etalon applications in visible or infrared optical wavelength spectrum, the optical materials such as BK7 or fused silica are usually used. Assuming that the refractive index of the material is n, the optical surface 42 and 43 are coated with reflective thin film of high reflectivity R, the thickness is h, and optical beam enters the etalon at approximately zero degree, the free spectrum range ($FSR_1$) of the etalon 44 can be expressed as: $\Delta\lambda = \lambda^2/(2nh)$, or $\Delta v = c/(2nh)$, where c is the speed of light. The transmission peak can be calculated by $v = mc/(2nh)$, where m is the order of interference, the spectrum width (full width half maximum or FWHM) of the transmission can be calculated by $FWHM = c(I-R)/(2\pi nhR^{1/2})$, where c is the speed of light. From the above formula, the free spectrum range (FSR) of etalon 44 is inversely proportional to the thickness h, i.e. the higher the $FSR_1$, the thinner of h. Assuming n=1.5, and the required $FSR_1$=100 GHz, then h is approximately equals to 1 mm. When the materials of etalon and the thickness is fixed, the transmission spectrum bandwidth or the finesse is mainly affected by the reflectivity R, the higher the reflectivity R, the narrower the transmission spectrum bandwidth. The Fabry-Perot etalon can achieve very narrow spectrum output and multiple frequency peaks with equal frequency interval in the very wide spectrum range, as illustrated in FIG. 8.

For applications in the fiber optic telecommunication, tunable lasers are required to provide very narrow bandwidth, and therefore high finesse etalon is usually required.

Liquid Crystal Based Optical Phase Modulator

The liquid crystal used in the photonics fields usually exhibit significant anisotropic orientational structure, and have high resistivity, and therefore can be considered as ideal dielectric material. Most nematic liquid crystals are uniaxial: they have one axis that is longer and preferred. Aligned nematic have the optical properties of uniaxial crystals, and they can be easily aligned by an external electric field. When an external electric field is applied to the liquid crystal, the dipole molecules tend to orient themselves along the direction of the field. The optical axis of the liquid crystal can be changed by changing the intensity of the external electric field. The liquid crystals are widely used in optical phase modulator, tunable filter, and other photonics devices, such as optical switch and power modulator, etc. The thickness of the liquid crystal layer used in these applications are typically about 10 urn. The tunable Fabry-Perot filter in this invention has been built based upon the optical properties of the liquid crystals.

Figure 4:
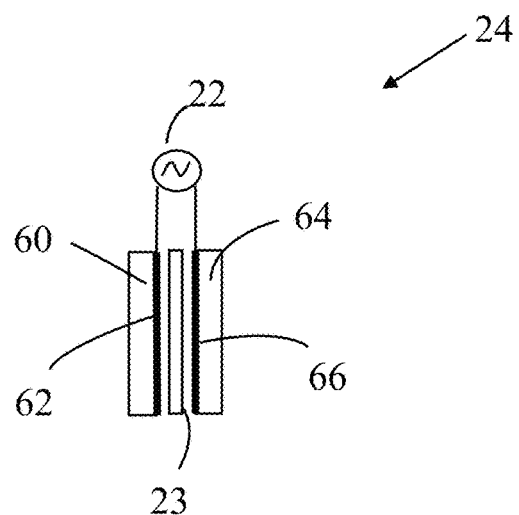
FIG. 4 is a schematic diagram of a liquid crystal based optical phase modulator.

FIG. 4 is a schematic diagram of a liquid crystal based optical phase modulator 24. The liquid crystal based optical phase modulator 24 comprises a transparent thin plate 60, liquid crystal 23, and a transparent thin plate 64. The electrode and isolation layer are coated on the inner surface 62 of the transparent thin plate 60; the electrode and isolation layer are coated on the inner surface 66 of the transparent thin plate 64; the driver 22 is connected to the electrodes. For the liquid crystal application as an optical phase modulator, the thickness of the liquid crystal lay is typically about 10 um.

Figure 5:
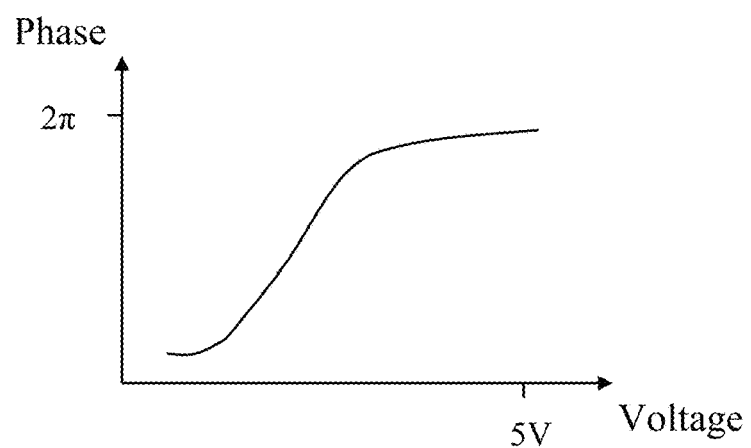
FIG. 5 is a schematic diagram of the relation between the applied voltage and the optical phase retardation for the liquid crystal based optical phase modulator.

FIG. 5 is a schematic diagram of the relation between the applied voltage and the optical phase retardation for the liquid crystal based optical phase modulator 24. The maximum optical phase retardation near 1550 nm wavelength is about 2n when a 10 KHz square wave electric field is applied.

Tunable Fabry-Perot Filter

Figure 6:
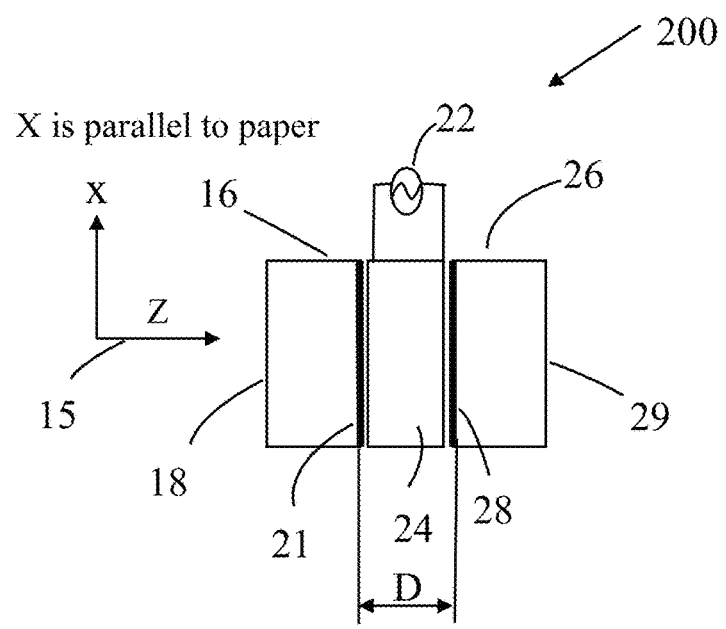
FIG. 6 is a schematic diagram of the tunable Fabry-Perot filter using the liquid crystal based optical phase modulator.

The tunable Fabry-Perot filter 200 shown in FIG. 6 comprises two optical glass plates 16 and 26 with high reflective dielectric thin film of reflectivity R coated on the inner surface 21 and 28 to form a Fabry-Perot cavity and a liquid crystal phase modulator 24 is sandwiched between optical glass plates 16 and 26; the out surface of optical plates 18 and 29 are coated with anti-reflection thin films. The high eigen-FSR (free spectrum range when the electric field is not applied) of tunable Fabry-Perot filter 200 can be achieved due to the thin layer of liquid crystal as described above. The refractive index of the liquid crystal can be changed by the applied electric field, and therefore, the transmission frequency peak v and free spectrum range (FSR) of the tunable Fabry-Perot filter 200 can also be changed by the applied electric field.

FIG. 6 shows a polarized light beam 15 with polarization direction along x axis propagating along z axis enters the tunable filter 200. Assuming the length of the Fabry-Perot cavity is D, the average refractive index of the material inside the Fabry-Perot cavity is n, the reflectivity of the thin film coatings of 21 and 28 is R, the FSR and transmission frequency can be expressed as $\Delta\lambda=\lambda^2/(2nD+\Gamma)$, or in frequency domain: $\Delta v=c/(2nD+\Gamma)$, where c is the speed of light, F represents the additional optical path by the liquid crystal under the applied electric field. The transmission frequency peak can expressed as $v=mc/(2nD+\Gamma)$, where m is the order of interference, and transmission bandwidth (FWHM) can be express as $\Delta v$ (FWHM)=$c(1-R)/((2nD+\Gamma)R^{1/2})$, where c is the speed of light.

As shown in FIG. 5, the relationship between the applied electric field of 10 khz square wave and the optical phase change for light at wavelength 1550 nm. The maximum $2\pi$ optical phase change can be achieved. The tunable Fabry-Perot filter 200 can achieve about 1.5 times eign-FSR frequency tuning range with less than 1 GHz tuning accuracy. The change of free spectrum range $\Delta v$ and transmission bandwidth are much smaller.

Figure 9:
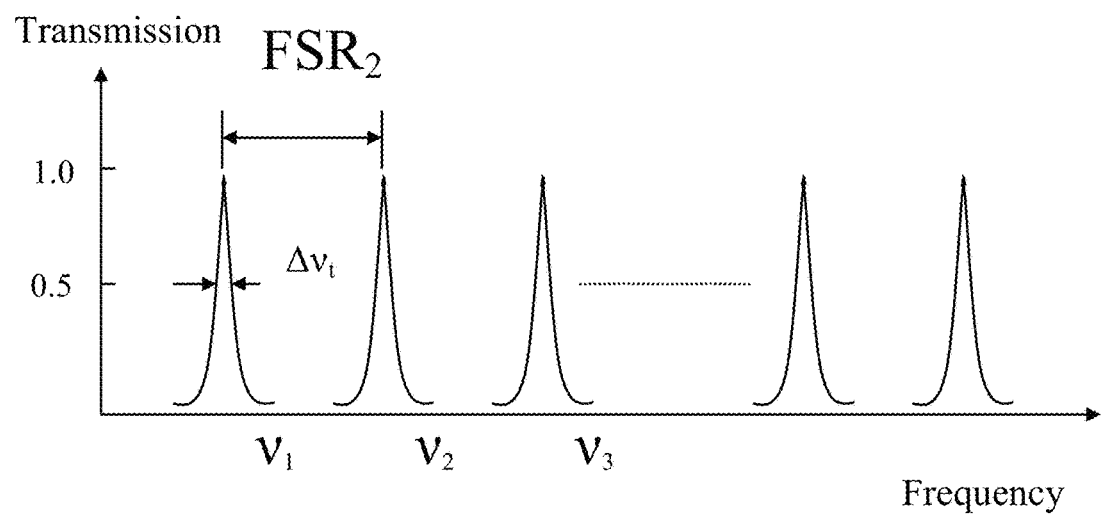
FIG. 9 shows the transmission spectrum of the tunable Fabry-Perot filter.

FIG. 9 illustrates the transmission spectrum for tunable filter 200. The fact that tunable filter 200 can achieve large transmission frequency tuning without significantly changing the transmission frequency bandwidth and free spectrum range is important for application in this invention.

The liquid crystal based optical phase modulator 24 is usually sandwiched between two transparent glass plates. Therefore, the thickness of the two transparent glass plates 60 and 64 will directly affect the Fabry-Perot cavity length D, hence the free spectrum range of the tunable Fabry-Perot filter 200 when the phase modulator 24 is sandwiched between glass plate 16 and 26. It is necessary to reduce the thickness of the glass plates 60 and 64 to decrease the cavity length D and to increase the free spectrum range of the tunable Fabry-Perot filter 200. Assuming that the thickness of the glass plates 60 and 64 are 0.5 mm, the refractive index is 1.5, the thickness of liquid crystal is 10 um, the maximum free spectrum range of the tunable Fabry-Perot filter 200 is about 100 GHz in the near infrared spectrum. Obviously, it is necessary to use thinner glass plates to make the tunable Fabry-Perot filter 200 with larger free spectrum range.

To achieve larger free spectrum range of the tunable Fabry-Perot filter 200, one method is to coat the inner surface of either glass plate 60 or 64 with high reflection coating before coating the electrodes and isolation layers. The Fabry-Perot cavity of the tunable filter 200 can then be formed by glass plate 16 and 64 or glass plate 60 and 26. Using such method can significantly reduce the Fabry-Perot cavity length and increase the free spectrum range of the tunable Fabry-Perot filter 200, and can also eliminate one of the glass plates 16 or 26. The drawback of this method is that it is more difficult to make such a tunable Fabry-Perot filter.

The fact that the liquid crystal phase modulator needs to be sandwiched between glass plate 16 and 26 to form a Fabry-Perot cavity makes it difficult to build such a tunable Fabry-Perot filter, especially for high finesse filters. Therefore, lower the fineness of Fabry-Perot filter makes it easier for manufacturing.

Figure 10:
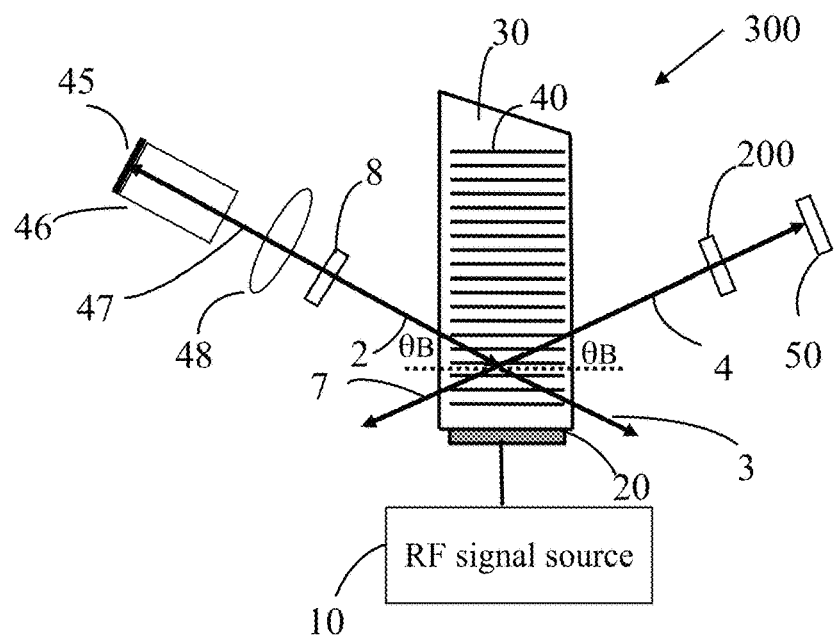
FIG. 10 is a schematic diagram of the first scheme of the invention.

Further detailed description is made below to the embodiment of the invention with reference to the drawings FIG. 10 is a schematic diagram of the first scheme of the invention. The tunable laser 300 comprises the first laser cavity mirror 45, the laser gain medium 46, the intracavity collimating lens 48, the active optical phase modulator 8, the tunable acousto-optic filter 100, the tunable Fabry-Perot filter 200 and the second laser cavity mirror 50, wherein the first laser cavity mirror 45 and the second laser cavity mirror 50 form a laser resonant cavity. For some gain medium such as semiconductor gain medium, the cavity mirror 45 can be directly plated on a laser gain medium. It is worth noting that the active optical phase modulator 8 may not be needed for some applications which do not need very accurate wavelength control, or do not need very narrow laser output spectrum. The tunable Fabry-Perot filter 200 is disposed in the optical axis of the first order diffracted light 4 of the tunable acousto-optic filter 100; the second laser cavity mirror 50 is disposed behind the tunable acousto-optic filter 100 with its optical axis aligned to the optical axis of the first order diffracted light 4. The tunable laser 300 further comprises a laser driver and control system, which includes a central control system, a laser pump source, a driver for the active optical phase modulator 8 and a driver for the tunable Fabry-Perot filter 200; the central control system is connected to the laser pump source, the driver for the active optical phase modulator 8, the radio frequency signal source 10 for the tunable acousto-optic filter 100 and the driver for the tunable Fabry-Perot filter 200 to perform the drive and control function for the tunable laser 300.

A laser cavity mirror differs in reflectivity for light with different frequencies or colors, and the reflectivity mentioned herein means a reflectivity corresponding to the frequency bandwidth of an operating laser. The first and second laser cavity mirror 45 and 50 can be either a partial reflection mirror or a total reflection mirror according to different situations. If the partial reflection mirror are used as laser cavity mirrors, some of the laser lights will output from these mirrors. When the laser gain medium is a semiconductor gain medium that has a relatively large output divergent angle, the intracavity collimating lens 48 of the tunable laser 300 is normally used. When the laser gain medium is gas, liquid or some solid media, the intracavity collimating lens is not often used, instead, a non-planar cavity mirror can be used to realize a reasonable distribution of intracavity light beams. When such lasers are used for fiber optical communication, an output light beam needs to be coupled to an optical fiber, so the collimating lens 48 is indispensable.

In the tunable laser 300, a wideband light beam 47 emitted from the laser gain medium 46 is collimated by the intracavity collimating lens 48 to form a light beam 2, the light beam 2 enters the acousto-optic crystal 30 of the tunable acousto-optic filter 100 at Bragg angle through the active optical phase modulator 8, a first-order diffracted light beam 4 propagates through the tunable Fabry-Perot filter 200 and is then reflected back into the laser cavity by the second laser cavity mirror 50, thus creating laser oscillation and amplification inside the laser cavity. During this process, two zero-order diffracted light beams 3 and 7 are generated as two laser outputs. As previously analyzed, the difference of the optical frequency of the light beam 3 and 7 are equal to the acoustic frequency of the tunable acousto-optic filter 100.

The output frequency or wavelength tuning for the tunable laser 300 is achieved by the active optical phase modulator 8 and the radio frequency signal source 10 for the tunable acousto-optic filter 100. The light wave resonant frequency in the laser cavity can be changed by changing the RF frequency of the radio frequency signal source 10 for the tunable acousto-optic filter 100. In accordance with different light wave resonant frequencies, the active optical phase modulator 8 enables a particular light wave to form laser oscillation and amplification in the laser cavity by regulating the phase of the light wave to meet the lasing oscillation conditions in the laser cavity.

The tunable Fabry-Perot filter 200 works as a conventional etalon when no external electric field is applied. The output frequency of the tunable laser 300 is regulated by the eigen transmission optical spectrum of the tunable Fabry-Perot filter 200, i.e., the output frequency of the tunable laser 300 can only be tuned to the transmission frequency peaks of the tunable Fabry-Perot filter 200. The transmission frequency peaks of the tunable Fabry-Perot filter 200 can be continuously tuned by the changing the applied electric field by the signal source 22 for the tunable Fabry-Perot filter 200, hence the output frequency of the tunable laser 300. Since the active optical phase modulator 8, the tunable acousto-optic filter 100, the tunable Fabry-Perot filter 200 have broad spectrum range, the tunable laser can be tuned continuously and precisely within a broad spectrum range.

The bandwidth of laser output spectrum are determined by the tunable Fabry-Perot filter 200. The use of the tunable Fabry-Perot filter 200 with a high finesse can compress the spectrum bandwidth of output light beam and increase the side mode suppression ratio.

Figure 12:
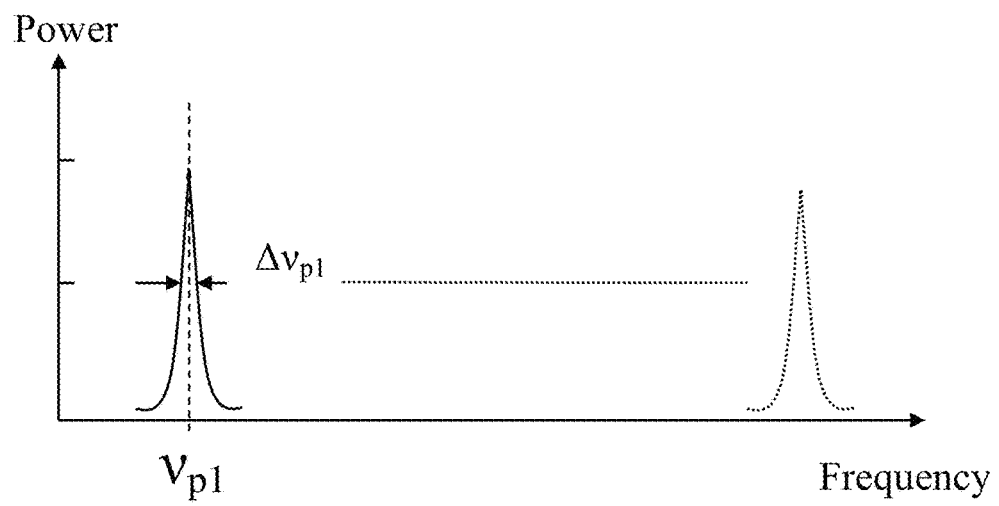
FIG. 12 shows the output spectrum of the first scheme of the invention.

FIG. 12 shows the output spectrum of the tunable laser 300. The output spectrum bandwidth $\Delta vp1$ (FWHM) is determined by the transmission spectrum bandwidth $\Delta vt$ of the tunable Fabry-Perot filter 200. The smaller the $\Delta vt$, the narrower the $\Delta vp1$.

In order to improve the stable operation of the tunable laser 300 under single mode oscillation, it is helpful to keep the free spectrum range of the tunable Fabry-Perot filter 200 larger than the eigen cavity oscillation spectrum (FWHM) $\Delta vL$ of the tunable laser 300, wherein $\Delta vL$ is defined as the laser cavity oscillation spectrum (FWHM) without the tunable Fabry-Perot filter 200. $\Delta vL$ is also affected by the diffraction spectrum width ($\Delta vc$) of the tunable acousto-optic filter 100, the smaller the $\Delta vc$, the smaller the $\Delta vL$. Since the change of free spectrum range of the tunable Fabry-Perot filter 200 is negligible during the tuning process, the tunable laser 300 is capable of maintaining stable single mode operation within a wide tuning spectrum range when the condition of free spectrum range of the tunable Fabry-Perot filter 200 larger than the eigen cavity oscillation spectrum (FWHM)$\Delta vL$ is met.

For the application in fiber optical DWDM telecommunication system, such as 100 GHz DWDM network, it is required that the output of the tunable laser 300 needs to meet the ITU (International telecommunication union) frequency grid, hence the transmission spectrum of the tunable Fabry-Perot filter 200. As analyzed previously, the tunable laser 300 can meet the conditions for stable single mode stable operation when the free spectrum range of the tunable Fabry-Perot filter 200 is equal to 250 GHz assuming the eigen spectrum width ($\Delta vL$) of the tunable laser 300 is equal to 200 GHz. The cavity length D of the tunable Fabry-Perot filter 200 is about 0.4 mm. Such a tunable Fabry-Perot filter is manufacturable and also capable of tuning the transmission frequency more than 250 GHz with less than 1 GHz tuning accuracy by the externally applied electric field according to the previous analysis.

The tunable laser 300 with adequate laser parameter settings can also meet the requirements for applications in 25 GHz and 50 GHz DWDM fiber optical network by the similar analysis. In the modern fiber optical telecommunication networks, the spectrum range about 1530 nm-1570 nm, or so called C-bend, and 1570 nm-1610 nm, or so call L-bend are most often used. Therefore, the tunable laser 300 can be meet requirements for accurate tuning within C and/or L bend spectrum range. Since the output spectrum of a tunable laser used in fiber optical DWDM networks such as 50 GHz or 100 GHz only needs to meet the ITU frequency grid, the continuous tuning with higher frequency interval is usually not required, another tunable laser 400 described below can meet this requirement.

Figure 11:
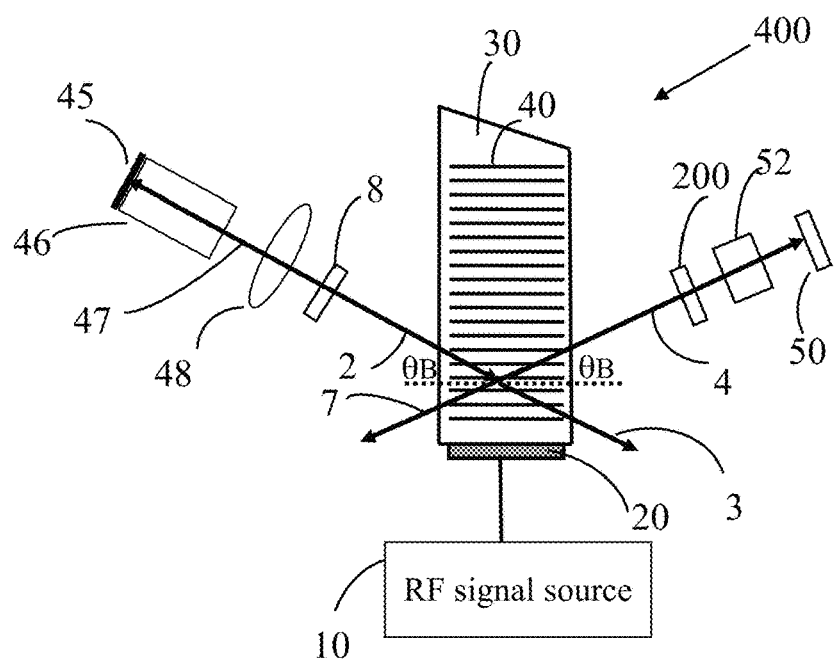
FIG. 11 is a schematic diagram of the second scheme of the invention.
Figure 13:
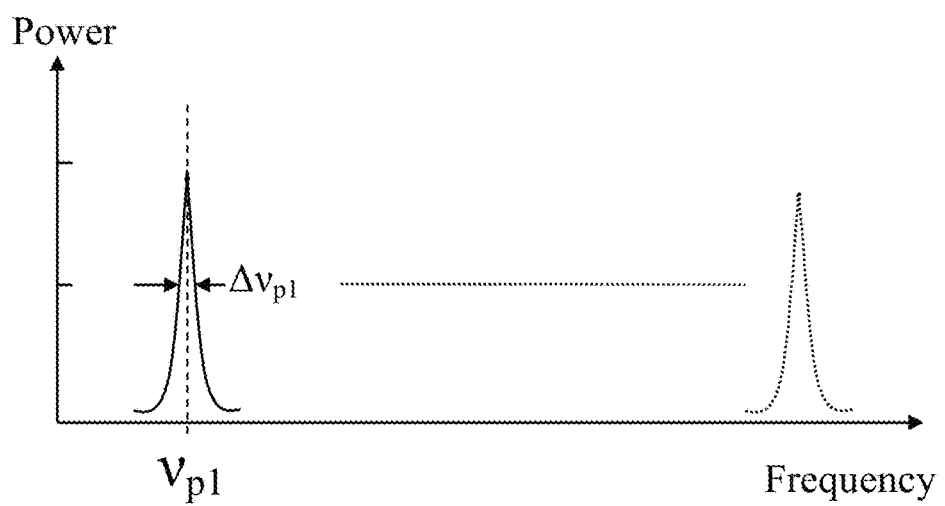
FIG. 13 shows the output spectrum of the second scheme of the invention.

The tunable laser 400 has a Fabry-Perot etalon 52 in the tunable laser 300 shown in FIG. 11. The transmission spectrum of the Etalon 52 matches the ITU grid of fiber optical telecommunication. Therefore, the tunable laser 400 can only be tuned to ITU grid frequencies. FIG. 13 shows the output spectrum of the tunable laser 400. Assuming that the etalon 52 has higher finesse than the tunable Fabry-Perot filter 200, the output spectrum ($\Delta vp2$) of the tunable laser 400 is determined by and proportional to the transmission spectrum width ($\Delta vc2$) of the etalon 52. Etalon 52 can be disposed between the mirror 50 and the tunable Fabry-Perot filter 200 as shown in FIG. 11, or between the tunable acousto-optic filter 100 and the tunable Fabry-Perot filter 200 in the optical axis of the beam 4.

Since it is relatively easier to make the etalon 52 with high finesse than the high finesse tunable Fabry-Perot filter 200, the advantages of the tunable laser 400 are 1) easier to compress the output spectrum width of the tunable laser 400, and 2) lower the finesse of the tunable Fabry-Perot filter 200 and therefore easier for manufacturing.

Figure 14:
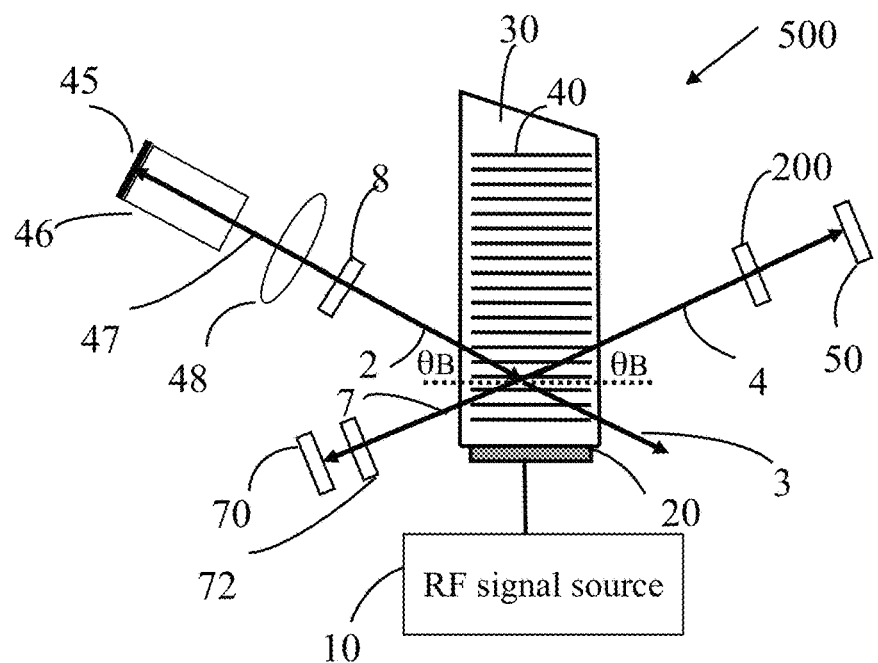
FIG. 14 is a schematic diagram of the first scheme of the invention with a wavelength locker.

The output frequency of laser 300 or 400 can be affected by some internal and external factors, such as temperature and mechanic vibration. It is particularly important to stabilize the laser output frequency or wavelength for applications such as optical telecommunication. It is helpful to use a wavelength locker to monitor and control wavelength for stable laser operations. A simple and effective method to incorporate a wavelength locker in a laser system such as laser 300 and 400 for application in optical fiber telecommunication is to use an etalon with the peak transmission frequency at ITU grid wavelength, a photo detector and a feedback loop to the laser control system. FIG. 14 shows the laser 500 with a wavelength locker. Etalon 72 is installed in the optical path of laser output beam 7 of laser 300 with a small angle to avoid reflecting the incident light back to the laser cavity: a photo detector 70 is installed behind etalon 72 to detect the transmission power from etalon 72. Any change in laser output frequency will cause an optical power change received by photo detector 70, and this information is feedback to the laser control system to pull back the shifted frequency or wavelength to its designated value. This simple frequency or wavelength locking method is particular effective for laser applications for optical telecommunication in which the laser's output frequencies usually need to be locked to the ITU grid frequency. In such case, the transmission frequency peak and free spectrum range (FSR) of etalon 72 can be designed to match the ITU grid. The sensitivity of the optical power change caused by laser output frequency shifts can be changed by different finesse of etalon 72.

Figure 15:
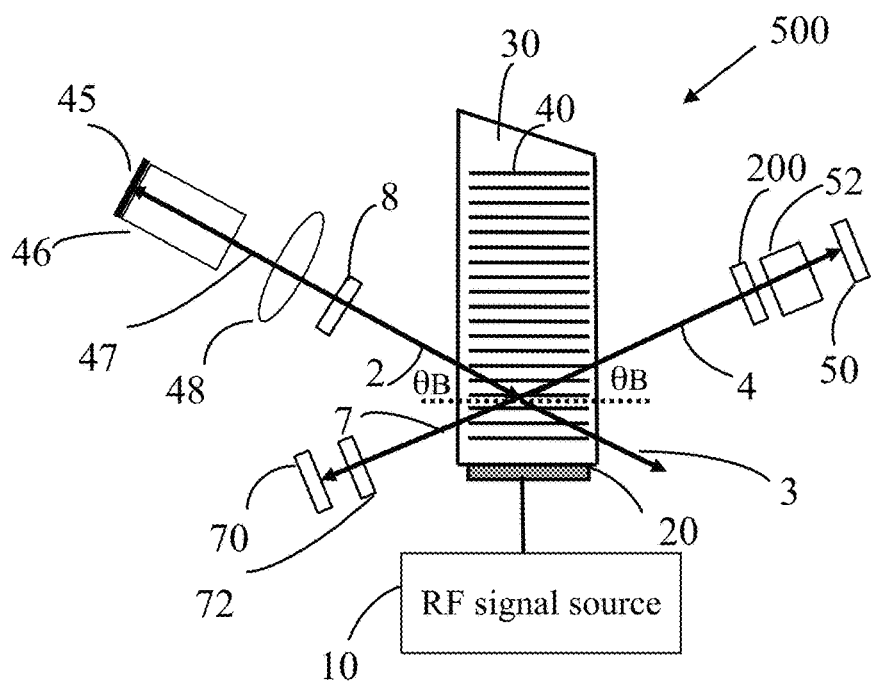
FIG. 15 is a schematic diagram of the second scheme of the invention with a wavelength locker.

Due to the periodic transmission nature of the etalon, the disadvantage of this frequency locking method is that it can only be useful for small frequency or wavelength shift less than the free spectrum range of etalon 72. For large frequency shift, an optical filter with linear optical power and frequency relationship within the required spectrum range may be used for locking the frequency. But, such method may have less wavelength locking accuracy than the one using an etalon especially for lasers with wide range frequency output. A combination of a linear filter and an etalon is therefore more effective for accurate wavelength locking for large frequency shift by splitting the beam 7 into two beams with one beam for coarse frequency locking by a linear filter and one beam for more accurate frequency locking by an etalon. The same frequency locking method and analysis can also be used for laser 400 shown in FIG. 15.

The above description is for demonstration and description only, not a detailed one without omission, and is not intended to limit the invention within the described specific forms. With the aforementioned description, many modifications and variations to the invention are possible. The chosen embodiments are merely for better explanation of the principle and practical applications of the invention. This description enables people familiar with this art to make better use of the invention, and to design different embodiment based on the actual needs and implement corresponding modifications.

The invention claimed is:

1. An external cavity tunable laser with a first output beam and a second output beam, the laser comprising:
a first laser cavity mirror, a laser gain medium, an intra-cavity collimating lens, an active optical phase modulator (OPM), a tunable acousto-optic filter (AOTF), a tunable Fabry-Perot filter (TFPF), a second laser cavity mirror, the first laser cavity mirror and the second laser cavity mirror forming a laser cavity; and
a laser drive and control system;
wherein the TFPF includes a glass plate and a liquid crystal OPM, the glass plate of the TFPF having an inner surface facing the liquid crystal OPM and an outer surface opposite the inner surface, the inner surface being coated with a highly reflective dielectric thin film and the outer surface being coated with an anti-reflection thin film;
wherein the liquid crystal OPM includes a first thin plate and a second thin plate and a liquid crystal disposed therebetween, each thin plate having an inner surface facing the liquid crystal and the inner surface of the second thin plate being coated with a high reflection coating, an electrode, and an isolation layer
wherein the intra-cavity collimating lens collimates a light beam transmitted from the laser gain medium and inputs the collimated beam into the AOTF at a Bragg angle to generate a zeroth order and a first-order first diffracted beam after passing through the active OPM;
wherein the TFPF is disposed on an opposite side of the AOTF from the laser gain medium and in an optical path of the first-order first diffracted beam generated by the AOTF;
wherein the second laser cavity mirror is disposed on the opposite side of the AOTF from the laser gain medium and behind the TFPF to reflect the first-order first diffracted beam back to the AOTF at the Bragg angle to generate a zeroth order and a first-order second diffracted beam after passing through the TFPF;
wherein an optical axis of the second laser cavity mirror is aligned to an optical axis of the first-order first diffracted beam;
wherein the AOTF and the TFPF operate together as a single mode and continuous wavelength tunable filter with a narrow spectrum output so that only the first-order diffracted beams resonate in the laser cavity; and
wherein the first output beam is the zeroth order first diffracted beam and the second output beam is the zeroth order second diffracted beam.

2. The external cavity tunable laser of claim 1,
wherein the TFPF has a transmission frequency with a tuning range and a free spectrum range; and
wherein the tuning range of the transmission frequency of the TFPF is equal to or larger than the free spectrum range of the TFPF.

3. The external cavity tunable laser of claim 1,
wherein the first laser cavity mirror and the second laser cavity mirror are at least one mirror selected from the group consisting of a plane mirror, a convex mirror and a concave mirror with equal to or less than 100% reflectivity;
wherein the first laser cavity mirror and the second laser cavity mirror have a spectrum range equal to or larger than a spectrum range of the laser gain medium; and
wherein the first laser cavity mirror is a multilayer dielectric thin film coated directly on the laser gain medium.

4. The external cavity tunable laser of claim 1, wherein the laser gain medium is a broadband laser gain medium.

5. The external cavity tunable laser of claim 1, wherein the active OPM is at least one modulator selected from the group consisting of an opto-electric, an acousto-optic, and an opto-magnetic optical phase modulator or a combination of the above optical phase modulators.

6. The external cavity tunable laser of claim 1, wherein the liquid crystal of the liquid crystal OPM is of a nematic type and has a spectrum range that is approximately equal to a spectrum range of the laser gain medium and the AOTF includes an anisotropic and birefringent crystal.

7. The external cavity tunable laser of claim 1,
wherein the laser drive and control system includes a central control system, a laser pump source, a driver for the active OPM and a driver for the TFPF; and
wherein the central control system is connected to the laser pump source, the driver for the active OPM, a radio frequency signal source of the AOTF and the driver for the TFPF to perform a laser drive and control function.

8. The external cavity tunable laser of claim 1,
further comprising a wavelength locker that includes a wavelength locking etalon, a photo detector and a photo detector signal processing unit;
wherein the wavelength locking etalon is disposed in the optical axis of the second laser output beam, the photo detector is disposed behind the wavelength locking etalon to detect the second output beam power after passing through the wavelength locking etalon, and the photo detector signal processing unit is connected to the photo detector and the laser drive and control system to process a signal from photo detector and feedback the signal to the laser drive and control system to perform the wavelength locking.

9. The external cavity tunable laser of claim 1, wherein the AOTF includes a single acousto-optic crystal, a single acoustic wave transducer bonded on a selected surface of the acousto-optic crystal and a radio frequency signal source.

10. An external cavity tunable laser having first output beam and a second output beam, the laser comprising:
a first laser cavity mirror, a laser gain medium, an intra-cavity collimating lens, an active optical phase modulator (OPM), a tunable acousto-optic filter (AOTF), a tunable Fabry-Perot filter (TFPF), an etalon, a second laser cavity mirror, the first laser cavity mirror and the second laser cavity mirror forming a laser cavity; and
a laser drive and control system;
wherein the TFPF includes a glass plate and a liquid crystal OPM, the glass plate of the TFPF having an inner surface facing the liquid crystal OPM and an outer surface opposite the inner surface, the inner surface being coated with a highly reflective dielectric thin film and the outer surface being coated with an anti-reflection thin film;
wherein the liquid crystal OPM includes a first thin plate and second thin plate and a liquid crystal disposed therebetween, each thin plate having an inner surface facing the liquid crystal and the inner surface of the second thin plate being coated with a high reflection coating, an electrode, and an isolation layer;
wherein the intra-cavity collimating lens collimates a light beam transmitted from the laser gain medium and inputs the collimated beam into the AOTF at a Bragg angle to generate a zeroth order and a first-order first diffracted beam after passing through the active OPM;
wherein the TFPF is disposed on the opposite side of the AOTF from the laser gain medium and in an optical path of the first-order first diffracted beam of the first diffracted beam generated by the AOTF;
wherein the etalon is disposed behind the TFPF;
wherein the second laser cavity mirror is disposed on the opposite side of the AOTF from the laser gain medium and behind the etalon to reflect the first-order first diffracted beam back to the AOTF at the Bragg angle to generate a zeroth order and a first-order second diffracted beam after passing through the etalon and the TFPF;
wherein an optical axis of the second laser cavity mirror is aligned to an optical axis of the first-order first diffracted beam;
wherein the AOTF and the TFPF operate together as a single mode and continuous wavelength tunable filter with a narrow spectrum output so that only the first-order diffracted beams resonate in the laser cavity; and
wherein the first output beam is the zeroth order first diffracted beam and the second output beam is the zeroth order second diffracted beam.

11. The external cavity tunable laser of claim 10,
wherein the TFPF has a transmission frequency with a tuning range and a free spectrum range; and
wherein the tuning range of the TFPF is equal to or larger than the free spectrum range of the TFPF.

12. The external cavity tunable laser of claim 10,
wherein the first laser cavity mirror and the second laser cavity mirror are at least one mirror selected from the group consisting of a plane mirror, a convex mirror and a concave mirror with equal to or less than 100% reflectivity;
wherein the first laser cavity mirror and the second laser cavity mirror have a spectrum range that is equal to or large than a spectrum range of the laser gain medium; and
wherein the first laser cavity mirror is a multilayer dielectric thin film coated directly on the laser gain medium.

13. The external cavity tunable laser of claim 10, wherein the laser gain medium is a broadband laser gain medium.

14. The external cavity tunable laser of claim 10,
wherein the active optical phase modulator is at least on modulator selected from the group consisting of an opto-electric, an acousto-optic, and opto-magnetic optical phase modulator or a combination of the above optical phase modulators.

15. The external cavity tunable laser of claim 10,
wherein the liquid crystal of the liquid crystal OPM is of a nematic type and has a spectrum range that is approximately equal to a spectrum range of the laser gain medium and the AOTF includes an anisotropic and birefringent crystal.

16. The external cavity tunable laser of claim 10,
wherein the laser drive and control system includes a central control system, a laser pump source, a driver for the active OPM and a driver for the TFPF; and
wherein the central control system is connected to the laser pump source, the driver for the active OPM, a radio frequency signal source of the AOTF and the driver for the TFPF to perform a laser drive and control function.

17. The external cavity tunable laser of claim 10,
further comprising a wavelength locker that includes a wavelength locking etalon, a photo detector and a photo detector signal processing unit;
wherein the wavelength locking etalon is disposed in the optical axis of the second output beam, the photo detector is disposed behind the wavelength locking etalon to detect the second output beam power after passing through the wavelength locking etalon, and the photo detector signal processing unit is connected to the photo detector and the laser drive and control system to process a signal from photo detector and feedback the signal to the laser drive and control system to perform the wavelength locking.

18. The external cavity tunable laser of claim 10, wherein the AOTF includes a single acousto-optic crystal, a single acoustic wave transducer bonded on a selected surface of the acousto-optic crystal and a radio frequency signal source.

* * * * *